(12) United States Patent
Nayak et al.

(10) Patent No.: US 10,018,994 B2
(45) Date of Patent: Jul. 10, 2018

(54) METHOD FOR DESIGNING A HIGH SENSITIVITY INTEGRATED COMPUTATIONAL ELEMENT

(71) Applicant: Halliburton Energy Services, Inc., Houston, TX (US)

(72) Inventors: Aditya B. Nayak, Houston, TX (US); James M. Price, The Woodlands, TX (US); David L. Perkins, The Woodlands, TX (US)

(*) Notice: Subject to any disclaimer, the term of this patent is extended or adjusted under 35 U.S.C. 154(b) by 130 days.

(21) Appl. No.: 14/906,359

(22) PCT Filed: Mar. 17, 2015

(86) PCT No.: PCT/US2015/021054
§ 371 (c)(1),
(2) Date: Jan. 20, 2016

(87) PCT Pub. No.: WO2016/148706
PCT Pub. Date: Sep. 22, 2016

(65) Prior Publication Data
US 2017/0108853 A1 Apr. 20, 2017

(51) Int. Cl.
G06F 17/50 (2006.01)
G05B 19/418 (2006.01)

(52) U.S. Cl.
CPC ..... G05B 19/4188 (2013.01); G06F 17/5036 (2013.01); G06F 17/5068 (2013.01); G05B 2219/45031 (2013.01); Y02P 90/02 (2015.11)

(58) Field of Classification Search
CPC ...... G05B 19/4188; G05B 2219/45031; G06F 17/5036; G06F 17/5068; Y02P 90/02
See application file for complete search history.

(56) References Cited

U.S. PATENT DOCUMENTS

| | | | | |
|---|---|---|---|---|
| 5,218,299 A | * | 6/1993 | Dunkel | G01R 33/3875 324/307 |
| 7,960,170 B2 | * | 6/2011 | Schulz | G01N 21/552 422/82.11 |
| 7,969,576 B1 | * | 6/2011 | Buckley | G01J 3/4338 356/437 |
| 2006/0044542 A1 | | 3/2006 | Park et al. | |

(Continued)

FOREIGN PATENT DOCUMENTS

WO WO 2014/074108 A1 5/2014
WO WO 2014/137322 A1 9/2014

OTHER PUBLICATIONS

International Search Report and the Written Opinion of the International Searching Authority, or the Declaration, Dec. 17, 2015, PCT/US2015/021054, 10 pages, ISA/KR.

*Primary Examiner* — Nha Nguyen (57) ABSTRACT

A system and method to design highly-sensitive Integrated Computational Elements for optical computing devices. A harmonic line shape is defined and used to simulate an optical response function which has a plurality of parameters that are varied until an ideal optical response function is determined. The ideal optical response function will be that function which maximizes the output sensitivity and/or minimizes the Standard Error of Calibration. Thereafter, the method designs a film stack having an optical response function that matches the ideal transmission function, and an ICE is fabricated based upon this design.

12 Claims, 9 Drawing Sheets

(56) References Cited

U.S. PATENT DOCUMENTS

| | | | |
|---|---|---|---|
| 2009/0324101 A1 | 12/2009 | Sung et al. | |
| 2010/0141948 A1* | 6/2010 | Cohen | G01B 11/0625 |
| | | | 356/369 |
| 2011/0085232 A1* | 4/2011 | Werner | B82Y 20/00 |
| | | | 359/350 |
| 2013/0035262 A1 | 2/2013 | Freese et al. | |
| 2014/0255598 A1* | 9/2014 | Simcock | G06F 17/50 |
| | | | 427/10 |
| 2015/0234976 A1* | 8/2015 | Chen | G06N 3/126 |
| | | | 716/132 |
| 2015/0300945 A1* | 10/2015 | Gao | G01N 21/274 |
| | | | 702/104 |
| 2015/0356204 A1* | 12/2015 | Simcock | G02B 7/008 |
| | | | 703/13 |

\* cited by examiner

| Layer | Material | Refractive Index | Extinction Coefficient | Optical Thickness (QWOT) | Physical Thickness (nm) |
|---|---|---|---|---|---|
| Medium | Air | 1.00000 | 0.00000 | | |
| 1 | Si 136H 6-25-2013 | 3.73535 | 0.01798 | 0.84071426 | 84.46 |
| 2 | SiO2 136H 6-25-2013 | 1.47434 | 0.00000 | 0.21787577 | 55.45 |
| 3 | Si 136H IN-Situ Layer1 7-1-2013 | 4.22925 | 0.07675 | 0.75850290 | 67.30 |
| 4 | SiO2 136H 6-25-2013 | 1.47434 | 0.00000 | 1.02413522 | 260.66 |
| 5 | Si 136H 8-1-2013 Insitu | 3.84484 | 0.01765 | 1.15770685 | 112.99 |
| 6 | SiO2 136H 8-1-2013 | 1.48170 | 0.00000 | 2.65226620 | 671.70 |
| 7 | Si 136H 8-1-2013 Insitu | 3.84484 | 0.01755 | 11.42922097 | 1115.47 |
| 8 | SiO2 136H 8-1-2013 Insitu | 1.48170 | 0.00000 | 2.36359385 | 598.60 |
| 9 | Si 136H 8-1-2013 Insitu | 3.84484 | 0.01755 | 6.59674669 | 643.83 |
| 10 | SiO2 136H 8-1-2013 Insitu | 1.48170 | 0.00000 | 1.65632329 | 419.47 |
| 11 | Si 136H 8-1-2013 Insitu | 3.84484 | 0.01755 | 1.33938891 | 130.72 |
| 12 | SiO2 136H 8-1-2013 Insitu | 1.48170 | 0.00000 | 1.43647961 | 363.80 |
| 13 | Si 136H 8-1-2013 Insitu | 3.84484 | 0.01755 | 1.42623371 | 139.20 |
| 14 | SiO2 136H 8-1-2013 | 1.48170 | 0.00000 | 2.66143216 | 674.03 |
| 15 | Si 136H 8-1-2013 Insitu | 3.84484 | 0.01755 | 6.94751767 | 678.07 |
| 16 | SiO2 136H 8-1-2013 | 1.48170 | 0.00000 | 1.71373994 | 434.02 |
| 17 | Si 136H 8-1-2013 Insitu | 3.84484 | 0.01755 | 9.27665099 | 905.39 |
| Substrate | BK7 1-10-2013 Alvarado | 1.52491 | 0.00000 | | |

FIG. 5A  Generic 17 layer stack with $\mu \sim 1700$ nm

|  | GOR | | Aromatics | | Methane | |
| --- | --- | --- | --- | --- | --- | --- |
|  | SEC | CS | SEC | CS | SEC | CS |
| Existing design process | 250 | 0.0236 | 0.07 | 31.9 | 0.0113 | 249 |
| Ultra-high sensitivity design process | 212 | 0.0309 | 0.059 | 58.8 | 0.013 | 458 |

METHOD FOR DESIGNING A HIGH SENSITIVITY INTEGRATED COMPUTATIONAL ELEMENT

The present application is a U.S. National Stage patent application of International Patent Application No. PCT/US2015/021054, filed on Mar. 17, 2015, the benefit of which is claimed and the disclosure of which is incorporated herein by reference in its entirety.

FIELD OF THE DISCLOSURE

The present disclosure relates generally to designing Integrated Computational Elements ("ICE") and, more specifically, to a method for designing a high sensitivity ICE thin-film stack.

BACKGROUND

In recent years, optical computing techniques have been developed for applications in the oil and gas industry in the form of optical sensors in downhole or surface equipment to evaluate a variety of fluid properties. In general, an optical computing device is a device configured to receive an input of electromagnetic radiation from a sample and produce an output of electromagnetic radiation from a processing element, also referred to as an optical element, wherein the output reflects the measured intensity of the electromagnetic radiation. The optical computing device may be, for example, an ICE. One type of an ICE is an optical thin film optical interference device, also known as a multivariate optical element ("MOE").

Fundamentally, optical computing devices utilize optical elements to perform calculations, as opposed to the hard-wired circuits of conventional electronic processors. When light from a light source interacts with a substance, unique physical and chemical information about the substance is encoded in the electromagnetic radiation that is reflected from, transmitted through, or radiated from the sample. Thus, the optical computing device, through use of the ICE and one or more detectors, is capable of extracting the information of one or multiple characteristics/analytes within a substance and converting that information into a detectable output signal reflecting the overall properties of a sample. Such characteristics may include, for example, the presence of certain elements, compositions, fluid phases, etc. existing within the substance.

Historically, ICEs have been designed using alternating layers of high index (e.g. Silicon) and low index (e.g. Silicon-di-oxide) materials on a transparent (e.g. BK7) substrate. The target ICE design is achieved by first generating a random design (random number of layers and layer thicknesses) and then running a minimization algorithm on the individual layer thicknesses using performance figure of merits such as the Standard Error in Calibration (SEC) or calibration sensitivity of the measurement as the error argument. The layer thicknesses, total number of layers, and the respective optical constants, of the high and low index materials and substrate, define the ICE design and thus its transmission profile. The transmission spectrum of ICE consists of transmission peaks and valleys across the range of wavelengths of interest. The transmission peaks/valleys are typically co-related to the analyte in question. The SEC and calibration sensitivity are calculated by projecting the transmission spectrum of the ICE design onto the optical database (i.e., the calibration data). The minimization algorithm stops when the lowest SEC or highest calibration sensitivity has been reached.

Certain ICE design algorithms are very advantageous in finding candidate designs having the lowest prediction error (SEC). However, it has been observed in recent studies that using an approach of beginning with randomized starting thickness may result in ½ of the possible maximum number of candidate designs with the highest calibration sensitivities. This approach requires more computing time and resources to achieve a larger number of candidate designs having the highest calibration sensitivities. Larger numbers of candidate designs are desired as they are further analyzed during the candidate finalization process, which involves spectrum visualization, parameter cross-plotting and tolerance-based fabrication analysis. Many candidate designs are rejected during this process. As a result, the fewer candidate designs with high calibration sensitivity enter the candidate finalization process, the fewer designs are output to choose from.

In view of the foregoing, there is a need in the art for an efficient, cost-effective ICE design technique to increase available candidate designs with high calibration sensitivity. Such a design technique would reduce computing requirements and computation cost.

DESCRIPTION OF ILLUSTRATIVE EMBODIMENTS

Illustrative embodiments and related methodologies of the present disclosure are described below as they might be employed in a method for designing a high sensitivity ICE thin-film stack. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

Illustrative embodiments of the present disclosure are directed to optimization design techniques for ICEs, such as MOEs, which are utilized in optical computing devices. In a generalized method of present disclosure, a harmonic line shape is defined and used to simulate an optical response function (e.g., transmission, reflection or absorption function). The harmonic line shape may be, for example, a Lorentzian, Gaussian or anharmonic derivative line shape. The harmonic line shape has a plurality of parameters which are varied until an ideal optical response function is determined. The ideal optical response function will be that function which maximizes the output sensitivity and/or minimizes the SEC, and/or some combination of both. Thereafter, the method designs a thin-film stack having an optical response function that matches the ideal optical response function, and an ICE may be fabricated based upon this design.

Figure 1:
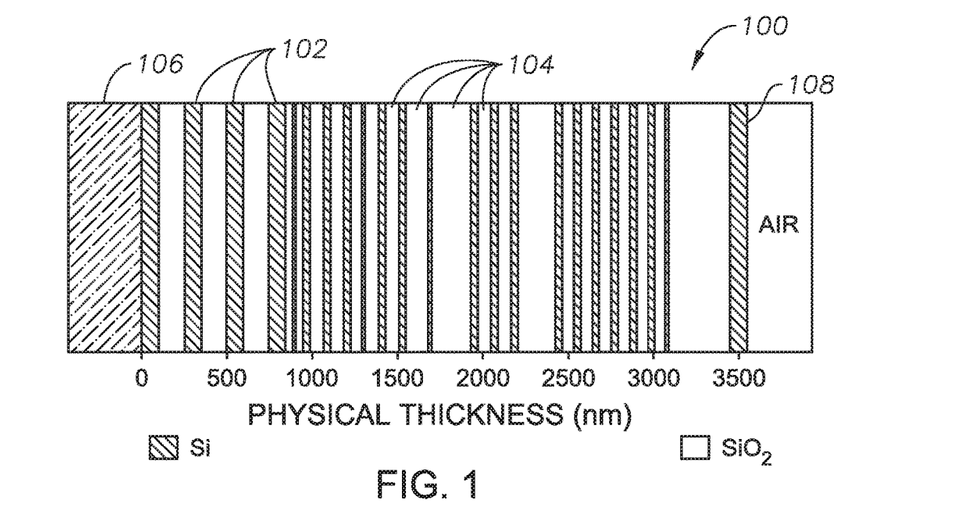
FIG. 1 illustrates an illustrative ICE structure which may be fabricated in accordance to embodiments of the present disclosure.

Referring to FIG. 1, an illustrative highly sensitive ICE 100 may be fabricated through utilization of the design optimization processes described herein. ICE 100 may include a plurality of alternating layers 102 and 104, such as, for example, silicon (Si) and quartz ($SiO_2$), respectively. Other non-limiting examples of layer material include niobium, germanium and Germania, $MgF_2$, $SiO_2$, and other high and low index materials, although persons of ordinary skill in the art having the benefit of this disclosure will understand that these layers consist of materials whose index of refraction is high and low, respectively. The layers 102, 104 may be strategically deposited on an optical substrate 106. In some embodiments, the optical substrate 106 is BK-7 optical glass. In other embodiments, the optical substrate 106 may be other types of optical substrates, such as quartz, sapphire, silicon, germanium, zinc selenide, zinc sulfide, or various plastics such as polycarbonate, polymethalmethacrylate PMMA), polyvinylchloride (PVC), diamond, ceramics, etc., as known in the art. At the opposite end (e.g., opposite the optical substrate 106), the ICE structure 100 may include a layer 108 that is generally exposed to the environmental air surrounding the device or installation. The number of layers 102, 104 and the thickness of each layer 102, 104 may be determined from the spectral attributes acquired from a spectroscopic analysis of a characteristic of the sample substance using a conventional spectroscopic instrument.

The spectrum of interest of a given characteristic of a sample typically includes any number of different wavelengths. It should be understood that the illustrative ICE 100 in FIG. 1 does not in fact represent any particular characteristic of a given sample, but is provided for purposes of illustration only. Consequently, the number of layers 102, 104 and their relative thicknesses, as shown in FIG. 1, bear no correlation to any particular characteristic of a given sample. Nor are the layers 102, 104 and their relative thicknesses necessarily drawn to scale, and therefore should not be considered to limit the present disclosure. Moreover, those skilled in the art will readily recognize that the materials that make up each layer 102, 104 may vary, depending on the application, cost of materials, and/or applicability of the material to the sample substance. For example, the layers 102, 104 may be made of, but are not limited to, silicon, quartz, germanium, water, combinations thereof, or other materials of interest. Furthermore, those same skilled persons will realize that the physical thicknesses of the layers 102 are illustrative in nature and, thus, may be altered as desired.

The multiple layers 102, 104 exhibit different refractive indices. By properly selecting the materials of the layers 102, 104 and their relative thicknesses and spacing, ICE 100 may be configured to selectively pass/reflect/refract/absorb predetermined fractions of light (i.e., electromagnetic radiation) at different wavelengths. Through the use of regression techniques, the corresponding output light intensity of the ICE structure 100 conveys information regarding a characteristic of the analyte of interest. Accordingly, selection of layer thickness and spacing are critically important to the ICE design process.

Figure 2:
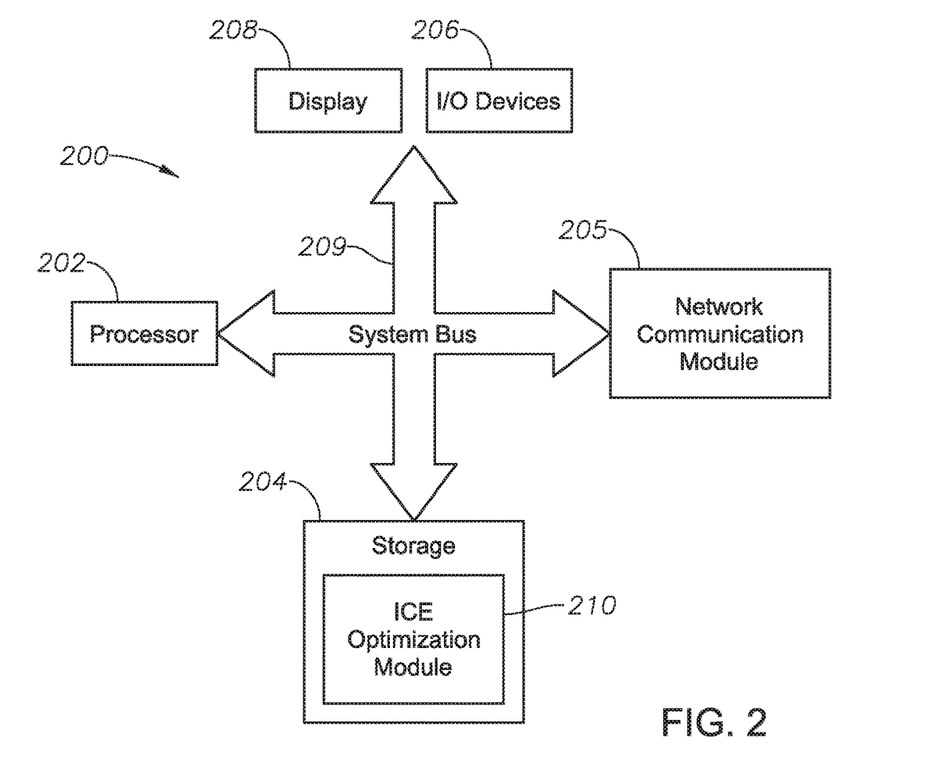
FIG. 2 illustrates a block diagram of an ICE design system in accordance to an illustrative embodiment of the present disclosure.

In view of the foregoing, FIG. 2 shows a block diagram of an ICE design optimization system according to an illustrative embodiment of the present disclosure. As will be described herein, ICE design system 200 provides a platform for ICE design optimization and analysis to facilitate the determination of rapid and efficient highly sensitive ICE designs. Illustrative embodiments of ICE design system 200 described herein evaluate harmonic line shapes using merit functions, to thereby determine ideal optical response functions which are used as the basis for designing ICE film stacks.

Referring to FIG. 2, ICE design system 200 includes at least one processor 202, a non-transitory, computer-readable storage 204, transceiver/network communication module 205, optional I/O devices 206, and an optional display 208 (e.g., user interface), all interconnected via a system bus 209. In one embodiment, the network communication module 205 is a network interface card (NIC) and communicates using the Ethernet protocol. In other embodiment, the network communication module 105 may be another type of communication interface such as a fiber optic interface and may communicate using a number of different communication protocols. Software instructions executable by the processor 202 for implementing software instructions stored within ICE design optimization module 210 in accordance with the illustrative embodiments described herein, may be stored in storage 204 or some other computer-readable medium.

Although not explicitly shown in FIG. 2, it will be recognized that ICE design system 200 may be connected to one or more public (e.g., the Internet) and/or private networks via one or more appropriate network connections. It will also be recognized that the software instructions comprising ICE design optimization module 210 may also be loaded into storage 204 from a CD-ROM or other appropriate storage media via wired or wireless methods.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Figure 3:
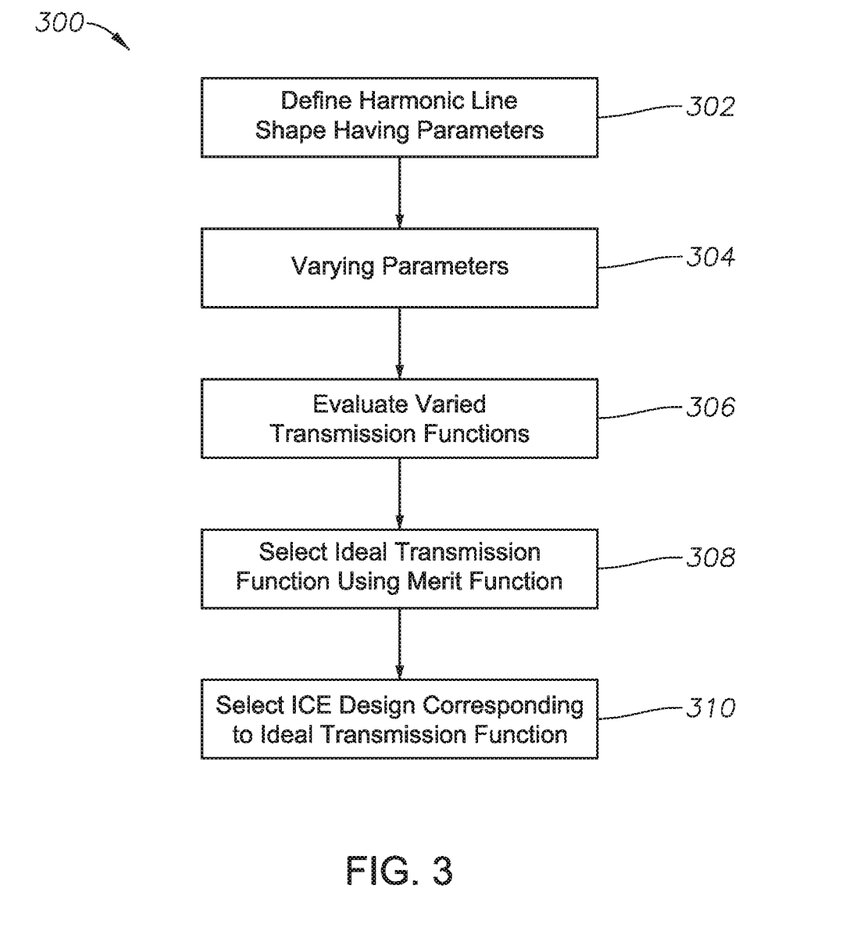
FIG. 3 is a flow chart detailing steps in a design process in accordance to an illustrative methodology of the present disclosure.
Figure 4:
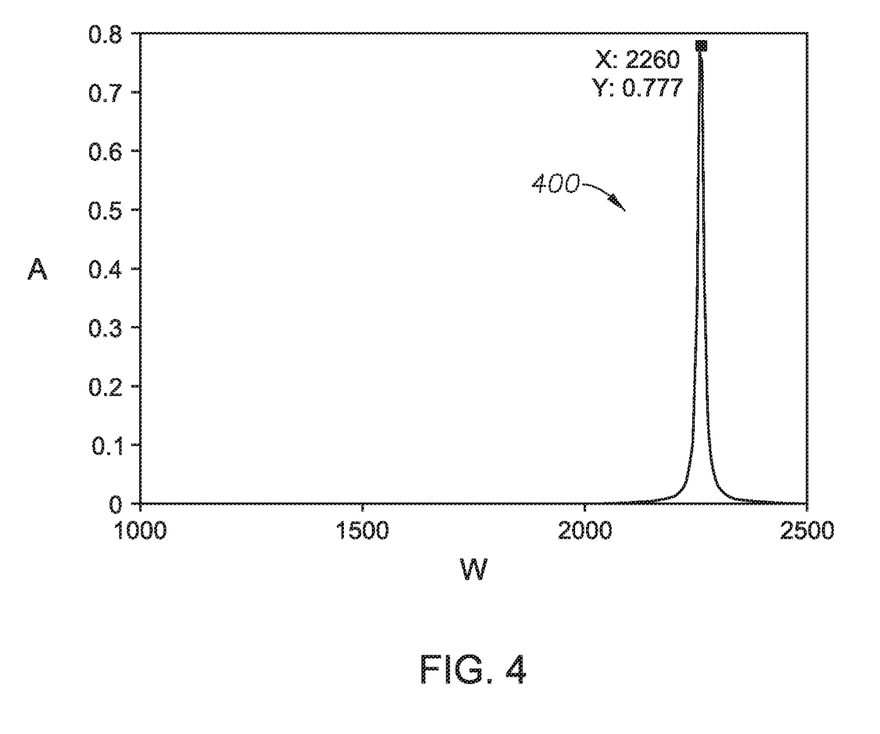
FIG. 4 is a graphical illustration of a calculated ideal optical transmission spectrum for gas-oil-ratio in accordance to an illustrative method of the present disclosure.

Referring to FIG. 3, an illustrative methodology of the present disclosure will now be described. As previously stated, illustrative embodiments of ICE design and optimization method 300 utilize harmonic oscillator line shapes to design highly sensitive ICE thin-film stacks with narrow band transmission peaks. At block 302, ICE design system 200 defines at least one harmonic line shape which simulates an optical response function having a plurality of parameters. The definition in block 302 may be at random or specifically chosen in other embodiments. An example of a harmonic line shape is shown in FIG. 4, which will be described in greater detail below. The harmonic oscillator line shape may be, for example, a Lorentzian, Gaussian function or anharmonic derivative, as described in Equation 1 below:

$$f(\omega) = \frac{A\Gamma^2}{\Gamma^2 + (\omega - \omega_0)^2}, \quad \text{Eq.(1)}$$

where A is the amplitude, $\Gamma$ is the broadening, and $\omega_0$ is the center wavelength parameter, and $\omega$ is the incident wavelength. In FIG. 4, the harmonic line shape is plotted as a simulated optical response function on a graph showing the amplitude, A, which respect to the center wavelength, $\omega_0$. The broadening, $\Gamma$, corresponds to the width of the line shape with respect to amplitude, A. Thus, the response function parameters of the illustrated harmonic line shape are A=0.7925, $\Gamma$=15 nm and $\omega_0$=2258.9 nm.

In this example method, at block 302, ICE design system 200 projects Equation 1 onto an optical database and varies the three parameters A, $\Gamma$ and $\omega_0$ at block 304. The optical database consists of many spectra collected over the concentration range of the analyte. The database contains calibration/validation data used to train or derive the optical response function. The sample set may include, for example, the analyte of interest over different ranges of concentration, temperatures, and pressures, as well as other interfering samples. Since the initial harmonic line shape may be chosen at random in this example, the line shape of FIG. 4 is shown only as an example. As the harmonic line shape is varied, the values of parameters A, $\Gamma$ and $\omega_0$ of its response function are varied accordingly and are iteratively projected onto the optical database via Equation 1. Therefore, the varied parameters result in varied optical response functions.

At block 306, each time ICE design system 200 varies the parameters, the new optical response function is then projected onto the optical database and the analyte concentration accuracy is evaluated using a merit function for the sensitivity and/or accuracy. In certain methods, this merit function consists of calculation of the design calibration sensitivity, defined as the slope of the ICE detector response vs. the analyte concentration. In other methods, however, the merit function may be the SEC of the varied optical response function for the characterization of a sample property. Still at block 306, when calibration sensitivity is utilized, ICE design system 200 iteratively analyzes the varied optical response spectrums for the characterization of the sample property until a global minimum is found that corresponds to a maximum output calibration sensitivity value. In this method, the global minimum is defined as the optical response function, defined as a single peak Lorentzian line shape, that give rise to the lowest SEC or highest calibration sensitivity in the parameter range. In those methods using the SEC as the merit function, the iteration continues until a global minimum is found that corresponds to a minimum SEC. In yet other methods, the varied optical response function having a threshold SEC and maximum output calibration sensitivity is selected. In other methods, the varied optical response having a threshold output sensitivity and minimum SEC may be selected.

Through use of the merit functions, methods of the present disclosure significantly reduce the computation time and complexity when compared to approaches that must analyze an n×m matrix for a given number of layers (n) and film thicknesses (m). Moreover, the algorithm described herein can run on a standard dual core computer and only takes a few seconds to execute and output the ICE design.

At block 308, ICE design system 200 selects the optical response function corresponding to the ideal harmonic line shape; this optical response function is referred to as the ideal optical response function. At block 310, ICE design system 200 selects the ICE design having an optical response function that matches the ideal optical response function. As defined herein, the ICE optical response function "matches" the ideal optical response function when the mean squared error between the two are within a predefined threshold, such as, for example, less than 5%. Here, in certain methods, ICE design system 200 utilizes a thin-film design software package to identify the optical film stack design that matches the selected optical response function. The generic thin-film design software may be, for example, Essential Macleod™, WVase™, or Matlab™. The selected design may be output in any variety of ways, such as, for example, via a computer display. Thereafter, an ICE thin-film stack may be fabricated based upon the selected design.

Now that an illustrative method has been described, examples will now be given with reference to FIG. 4, which plots an illustrative calculated ideal optical response function for gas-oil ratio. The examples given below are comparative studies contrasting a first design approach and the illustrative methods of the present disclosure. Design studies were run for three analytes: gas-oil ratio ("GOR"), Aromatics and Methane. For GOR, the highest conventional sensitivity design had a calibration sensitivity of 36.06% of full scale and a SEC of 16.36% of full scale. Using the same spectral database for GOR, the design process of the present disclosure gave an ideal harmonic line shape 400, a Lorentzian function in this example with an amplitude of 0.7925, broadening=15 nm, center wavelength=2258.9 nm, SEC=14% of full scale and calibration sensitivity=56% of full scale (shown in FIG. 4). As can be seen, the SEC was 2% (absolute) better and calibration sensitivity was 20% (absolute) better when compared to the first design suite.

Figure 5A:
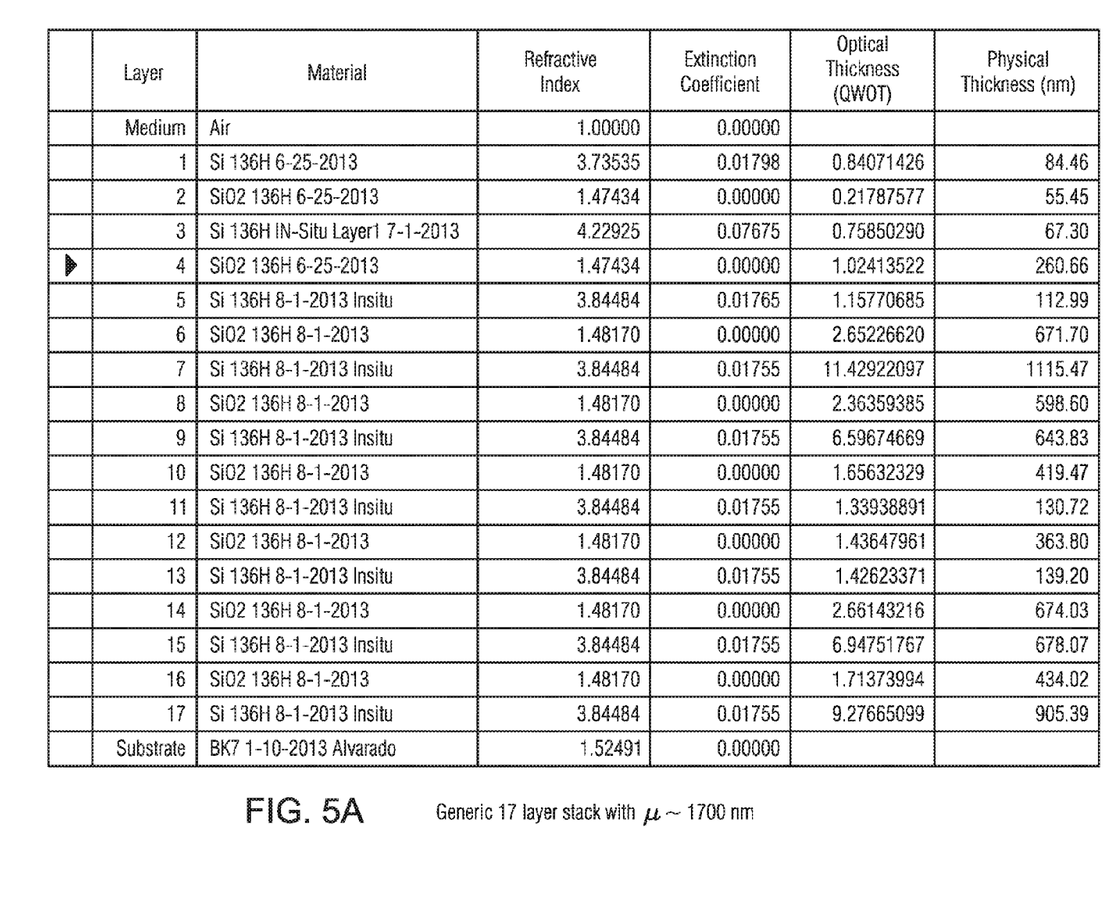
FIG. 5A is a screen shot showing spectral data for a generic seventeen layer design forming the basis for a design process in accordance to an illustrative method of the present disclosure.
Figure 5B:
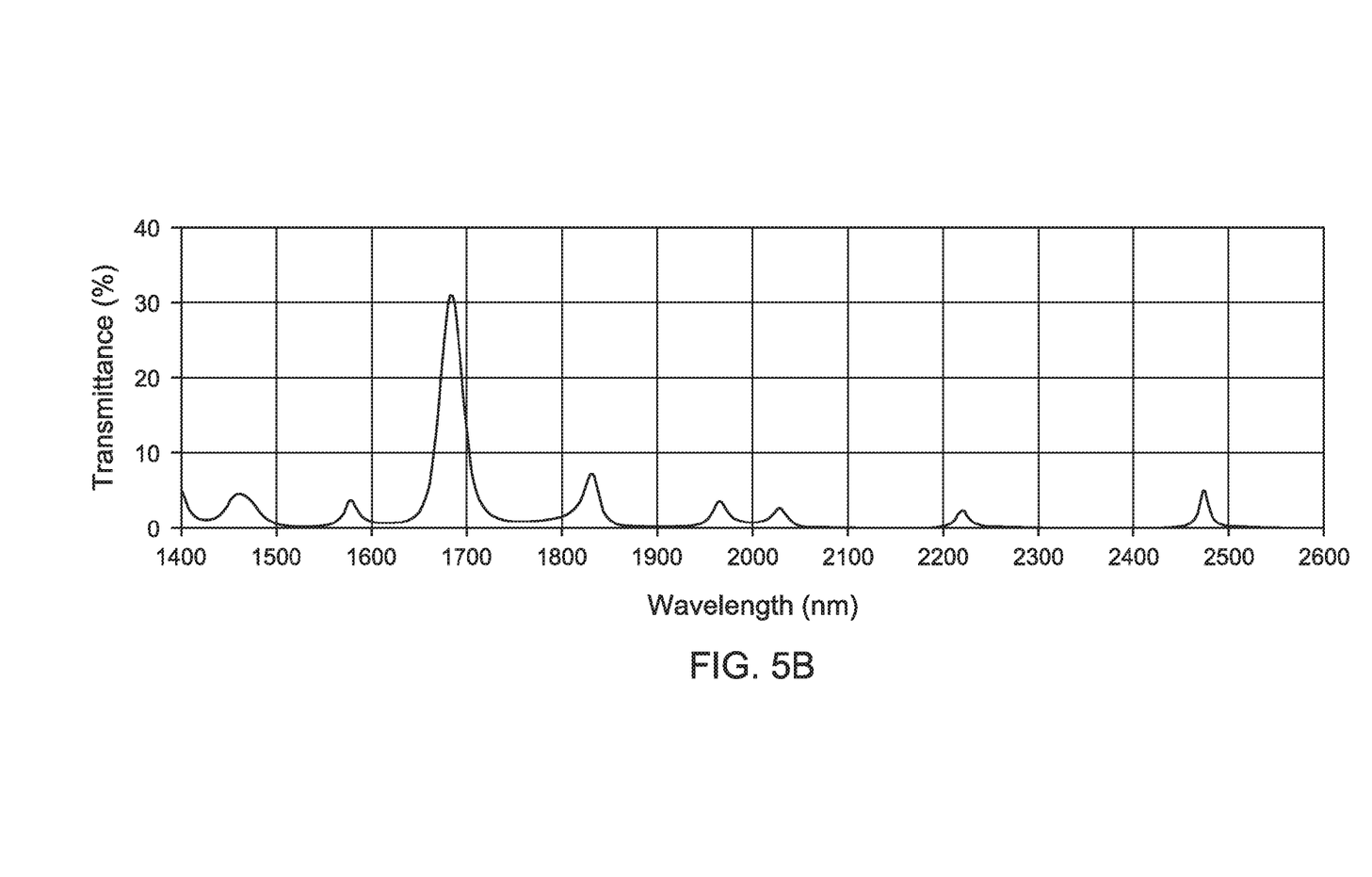
FIG. 5B is a graphical illustration of an optical transmission spectrum for the generic seventeen layer film stack of FIG. 5A.
Figure 5C:
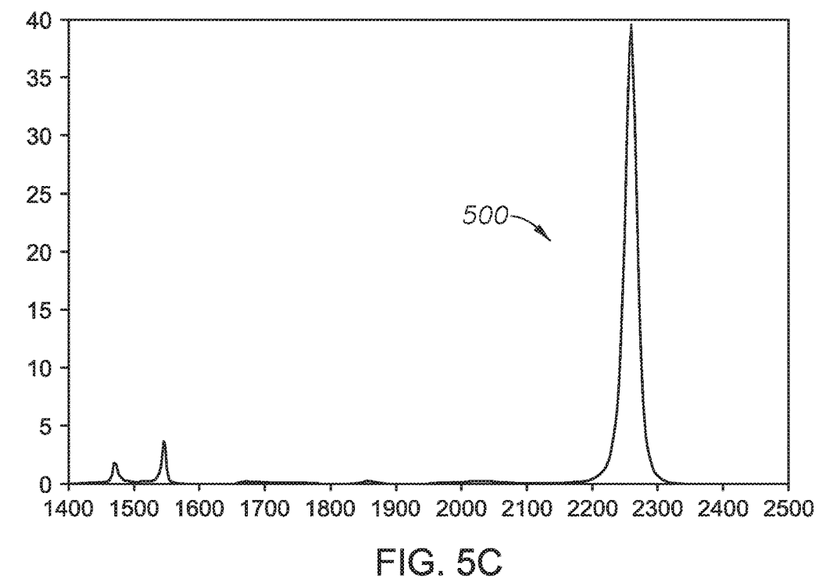
FIG. 5C graphically illustrates a transmission spectrum of a fabricatable design which best matches an ideal Lorentzian function for gas-oil-ratio in accordance to an illustrative method of the present disclosure.

As previously described, the harmonic line shapes (i.e., Lorentzian function 400) are treated as an optical response functions (e.g., transmission function). Thus, function 400 was selected as the ideal optical response function. Thereafter, in the study, ICE design system 200 used a generic seventeen layer design with a center wavelength $\omega_0$ around 1700 nm as the seed thin film stack. FIG. 5A shows the spectral data for the generic seventeen layer design, and FIG. 5B shows the response function of the generic seventeen layer design. ICE design system 200 then, via a thin-film design software, iteratively altered the layer thicknesses of each layer in the stack until a response function was found which matched the ideal Lorentzian function 400. Here, the design algorithm began with the generic film stack design (shown in FIG. 5B) and converged on the desired ideal Lorentzian function, shown in FIG. 5C. FIG. 5C illustrates the resulting fabricatable Lorentzian function 500 which is an eighteen layer stack and around 8 microns thick. The SEC of this "fabricatable" Lorentzian design was 212 and the calibration sensitivity was 0.0309, which was still roughly 30% better than the first design approach. Therefore, the sensitivity of the design provided by embodiments of the present disclosure was much more sensitive than that of the first approach.

Figure 6:
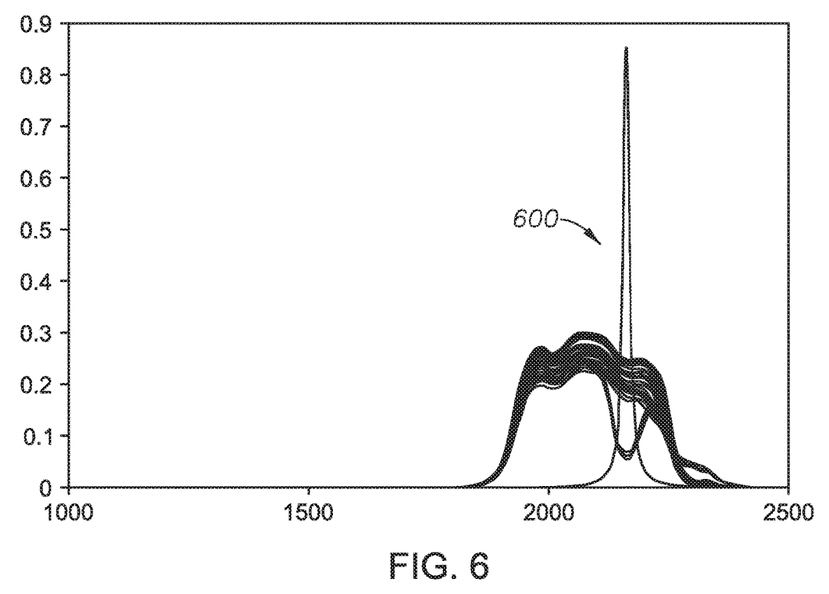
FIG. 6 graphically illustrates a transmission function of an ideal Lorentzian function for Aromatics calculated in accordance to an illustrative method of the present disclosure.
Figure 7:
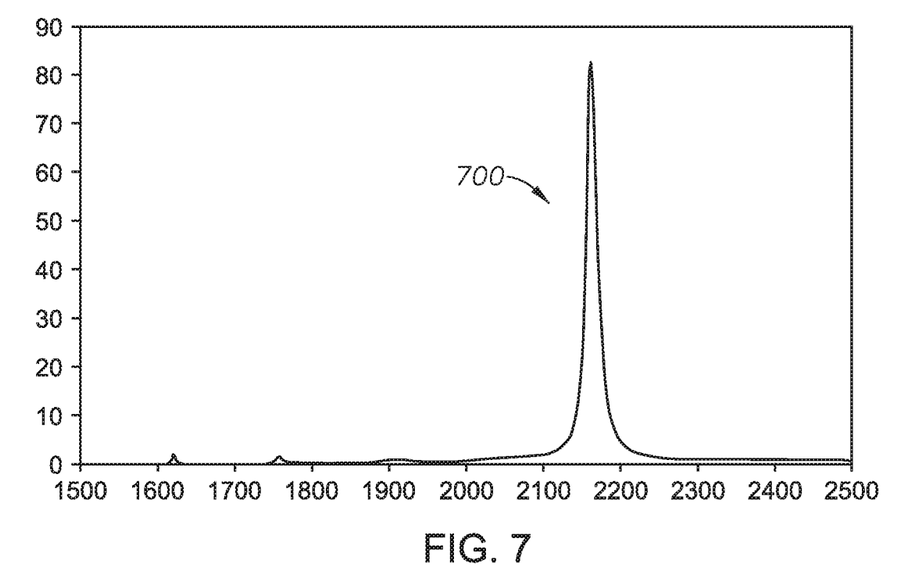
FIG. 7 graphically illustrates a transmission function of a fabricatable design that best matches the ideal Lorentzian function of FIG. 6.

As another example, the same design study was run for Aromatics. For Aromatics, using the first design suite process, the highest sensitivity design had a calibration sensitivity of 31.9 and a SEC of 0.07. Using the same spectral database for Aromatics, the ultra-high sensitivity design process of the present disclosure gives a Lorentzian function with an amplitude of 0.85, broadening=15 nm, center wavelength=2162.9 nm, SEC=0.059 and calibration sensitivity=62.9, as shown in FIG. 6. The SEC of ideal Lorentzian function 600 was 18% better and calibration sensitivity was 50% better compared to the first design suite. The resulting fabricatable Lorentizian function 700, shown in FIG. 7, was a twenty-two layer stack and around 8 microns thick. The SEC of this "fabricatable" Lorentzian design was 0.059 and calibration sensitivity was 58.8, still about 45% better than the current design suite.

Figure 8:
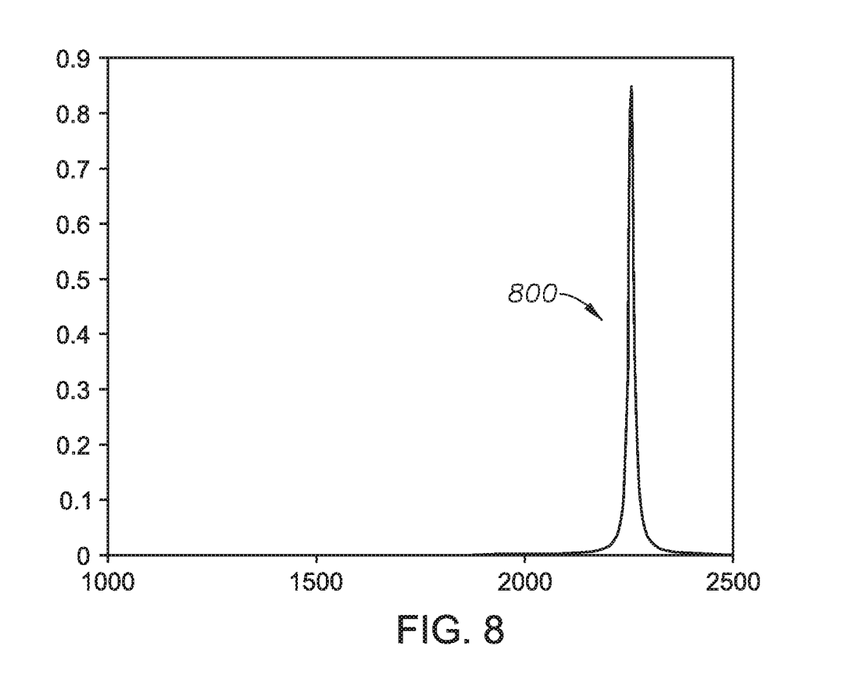
FIG. 8 graphically illustrates a transmission function of an ideal Lorentzian function for Methane calculated in accordance to an illustrative method of the present disclosure.
Figure 9:
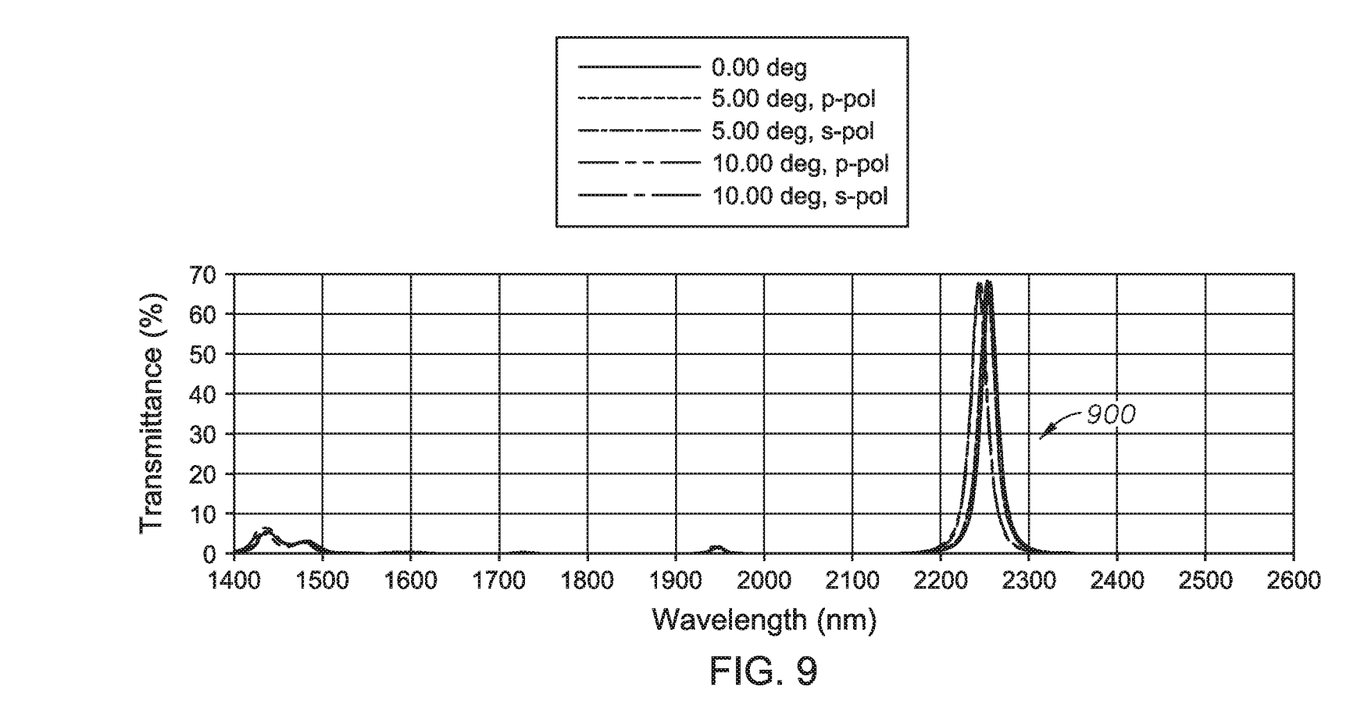
FIG. 9 graphically illustrates a transmission function of a fabricatable design that best matches the ideal Lorentzian function of FIG. 8.

As a third example, the same design study was run for Methane (C1). For C1, and using the first design suite process, the highest sensitivity design had a calibration sensitivity of 249 and a SEC of 0.01128. Using the same spectral database for C1, the ultra-high sensitivity design process of the present disclosure gives a Lorentzian function 800 with an amplitude of 0.85, broadening=15 nm, center wavelength=2256 nm, SEC=0.0136 and calibration sensitivity=482, as shown in FIG. 8. The SEC was 20% worse and calibration sensitivity was 49% better compared to ideal Lorentzian function 800 of the presently disclosed design suite. 20% worse SEC was only about 2% worse when normalized to concentration and hence, was acceptable. The resulting fabricatable Lorentizian function 900 shown in FIG. 9 was a twenty two layer stack and around 8 microns thick. The SEC of this "fabricatable" Lorentzian design was 0.013 and calibration sensitivity was 458, still about 45% better than the first design suite. Moreover, FIG. 9 also shows that the response function does not change much with a +/−10 degree change in the angle of the incident light, which was critical to the measurement accuracy of the ICE.

Figure 10:
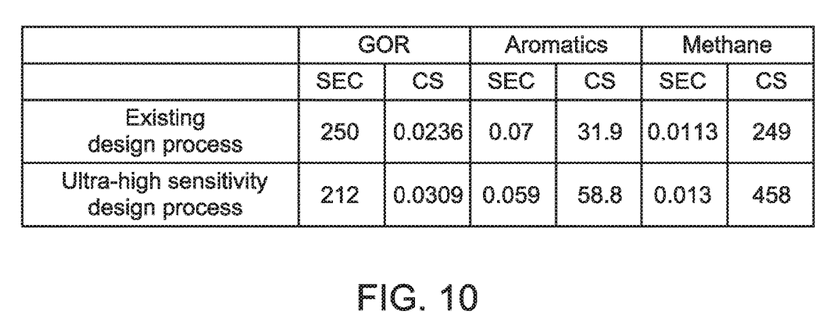
FIG. 10 is a table summarizing three different design studies performed to compare the presently disclosed design method to another design approach.
Figure 11:
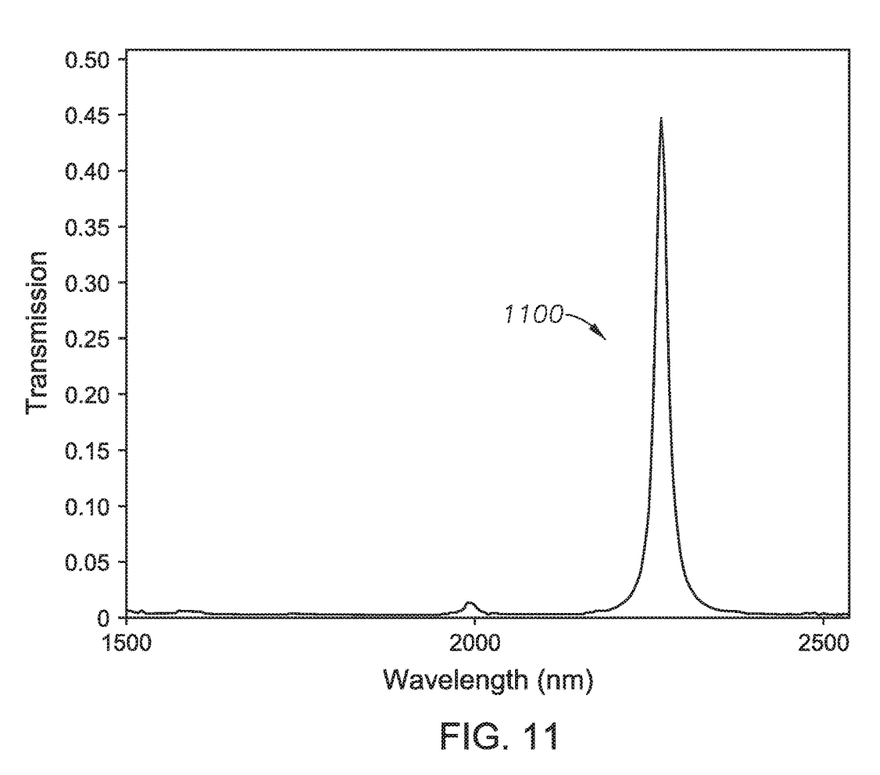
FIG. 11 illustrates the optical transmission spectrum for an ICE fabricated based upon the highly-sensitive design process of the present disclosure.

FIG. 10 is a table summarizing the results of the three different studies comparing the first design process with the ultra-high sensitivity design process of the current disclosure. The chart lists the SEC and calibration sensitivity ("CS") values for various analytes, namely GOR, Aromatics and Methane. To complete the study, the illustrative ICE design for C1 was actually reduced to practice and fabricated using an ion-assisted e-beam vacuum deposition technology designed for ICE core fabrication. The resulting response function 1100 is shown in FIG. 11. The fabricated design had an SEC=0.01333 and calibration sensitivity=423, very close to the intended ideal design.

In an alternative embodiment of the present disclosure, multivariate spectral analysis is utilized to minimize the range of wavelengths swept during the iterative process of generating the varied optical response spectrums (e.g., in block 304 of FIG. 3). By minimizing the swept wavelength range, those wavelengths outside the range are ignored thereby making the design process faster and more efficient. Therefore, in this illustrative embodiment, the design process is seeded with modeled results from a preliminary multivariate spectral analysis (e.g., PLS study) of the spectral data in the wavelength space. In most cases, a traditional multivariate spectral analysis (e.g., PLS, PCR, etc.) is performed on a complete spectral data set. For example, this may encompass a wavelength range of 1000-5000 nm.

This preliminary study determines what spectral range to restrict the ICE design process to (i.e., "the bandpass") and the expected performance (e.g., SEC) by chemometric methods. This study results in a 2D matrix of SEC values as a function of starting and ending wavelengths. During the design process, the center wavelength parameters are varied within this range. In certain embodiments, this matrix may be performed at a wavelength spacing of 10 nm, but is not restricted to this "resolution". The information contained in the 2D matrix is searched and sorted by the ICE design system to find those wavelength intervals that have good performances, and would be analogous to Lorentzian distribution profiles of that wavelength interval (width). Therefore, this illustrative method simplifies the search method described above. In other words, this method prioritizes the Lorentzian profiles centered in chemometrically relevant wavelengths with an expectation of the width and amplitude.

With reference back to FIG. 3, in an alternate method of the present disclosure, block 302 includes defining at least two harmonic line shapes, wherein the lines shapes are computationally combined to generate a combined harmonic line shape. Once the first optimum line shape is found, a second line shape is then added to the first one and the second line shape parameters are varied as previously described to see if the merit function can be further reduced. This would be called the global minimum for two line shapes combined. Once the combined optical response function is found, the same process (blocks 304-310) is followed, i.e., using a thin-film software to find the layer thicknesses that match the optical response function.

Through utilization of the present disclosure, highly-sensitive ICE designs can be cost-effectively achieved. The described design process is simpler and less time consuming when compared to other approaches. Moreover, the illustrative design methods described herein generally return ICE designs with roughly two times better sensitivities when compared to other approaches.

The foregoing methods and systems described herein are particularly useful in designing ICEs for use in wellbores such as, for example, optical fluid identification tools for downhole and surface applications. In one illustrative application, once the design of the ICE has been optimized, it is then fabricated and positioned downhole or as part of an optical computing device of a downhole assembly to perform monitoring or sensing operations.

Embodiments and methods described herein further relate to any one or more of the following paragraphs:

1. A method to design an integrated computation element ("ICE"), the method comprising defining at least one harmonic line shape that simulates an optical response function; varying parameters of the harmonic line shape to thereby generate one or more varied optical response functions; evaluating the varied optical response functions for a characterization of a sample property using a merit function; based upon a merit function performance of the varied optical response functions, selecting an ideal optical response function; and selecting an ICE design having an optical response function that matches the ideal optical response function.

2. A method as defined in paragraph 1, wherein the optical response function of the ICE design matches the ideal optical response function when a squared mean error between the optical response function of the ICE design and the ideal optical response function is less than 5%.

3. A method as defined in paragraphs 1 or 2, wherein defining the at least one harmonic line shape comprises defining at least one of a Lorentzian, Gaussian or anharmonic derivative line shape.

4. A method as defined in any of paragraphs 1-3, wherein the at least one harmonic line shape is defined at random.

5. A method as defined in any of paragraphs 1-4, wherein varying the parameters of the harmonic line shape comprises varying at least one of an amplitude, broadening, or central wavelength parameter of the optical response function.

6. A method as defined in any of paragraphs 1-5, wherein varying the parameters of the harmonic line shape further comprises utilizing multivariate spectral analysis to define an optimal wavelength range; and varying the parameters of the harmonic line shape within the optimal wavelength range.

7. A method as defined in any of paragraphs 1-6, wherein using the merit function comprises at least one of determining a standard error of calibration ("SEC") of the varied optical response function for the characterization of the sample property; or determining an output sensitivity of the varied optical response function for the characterization of the sample property.

8. A method as defined in any of paragraphs 1-7, wherein selecting the ideal optical response function comprises selecting the varied optical response function having a maximum output sensitivity; selecting the varied optical response function having a minimum SEC; selecting the varied optical response function having a threshold SEC and maximum output sensitivity; or selecting the varied optical response function having a threshold output sensitivity and minimum SEC.

9. A method as defined in any of paragraphs 1-8, further comprising fabricating an ICE based upon the selected ICE design.

10. A method as defined in any of paragraphs 1-9, wherein defining the harmonic line shape comprises defining at least two harmonic line shapes; and computationally combining the at least two harmonic line shapes to generate a combined harmonic line shape.

11. A system comprising processing circuitry to implement any of the methods in paragraphs 1-10.

12. An integrated computation element ("ICE") fabricated using any of the methods of paragraphs 1-10.

13. A computer program product comprising instructions which, when executed by at least one processor, causes the processor to perform any of the methods of paragraphs 1-10.

14. A method to design an integrated computation element ("ICE"), the method comprising defining a harmonic line shape that simulates an optical response function; varying the optical response function to thereby determine an ideal optical response function; and selecting an ICE design that matches the ideal optical response function.

15. A method as defined in paragraph 14, wherein defining the harmonic line shape comprises defining a Lorentzian, Gaussian or anharmonic derivative line shape.

16. A method as defined in paragraphs 14 or 15, wherein varying the optical response function comprises varying an amplitude, broadening or central wavelength parameter of the optical response function.

Furthermore, the illustrative methodologies described herein may be implemented by a system comprising processing circuitry or a computer program product comprising instructions which, when executed by at least one processor, causes the processor to perform any of the methodology described herein.

Although various embodiments and methodologies have been shown and described, the disclosure is not limited to such embodiments and methodologies and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A method to design a multivariate optical element ("MOE"), the method comprising:
   defining at least one harmonic line shape that simulates an optical response function;
   varying parameters of the harmonic line shape to thereby generate one or more varied optical response functions;
   evaluating the varied optical response functions for a characterization of a sample property using a merit function;
   based upon a merit function performance of the varied optical response functions, selecting an ideal optical response function;
   selecting an MOE design having an optical response function that matches the ideal optical response function; and
   fabricating an MOE based upon the selected MOE design.

2. The method as defined in claim 1, wherein the optical response function of the ICE design matches the ideal optical response function when a squared mean error between the optical response function of the MOE design and the ideal optical response function is less than 5%.

3. The method as defined in claim 1, wherein defining the at least one harmonic line shape comprises defining at least one of a Lorentzian, Gaussian or anharmonic derivative line shape.

4. The method as defined in claim 1, wherein the at least one harmonic line shape is defined at random.

5. The method as defined in claim 1, wherein varying the parameters of the harmonic line shape comprises varying at least one of an amplitude, broadening, or central wavelength parameter of the optical response function.

6. The method as defined in claim 5, wherein varying the parameters of the harmonic line shape further comprises:
   utilizing multivariate spectral analysis to define an optimal wavelength range; and
   varying the parameters of the harmonic line shape within the optimal wavelength range.

7. The method as defined in claim 1, wherein using the merit function comprises at least one of:
   determining a standard error of calibration ("SEC") of the varied optical response function for the characterization of the sample property; or
   determining an output sensitivity of the varied optical response function for the characterization of the sample property.

8. The method as defined in claim 7, wherein selecting the ideal optical response function comprises:
   selecting the varied optical response function having a maximum output sensitivity;
   selecting the varied optical response function having a minimum SEC;
   selecting the varied optical response function having a threshold SEC and maximum output sensitivity; or
   selecting the varied optical response function having a threshold output sensitivity and minimum SEC.

9. The method as defined in claim 1, wherein:
   defining the harmonic line shape comprises defining at least two harmonic line shapes; and
   computationally combining the at least two harmonic line shapes to generate a combined harmonic line shape.

10. A system comprising processing circuitry to implement the method of any one of claims 1-8 or 9.

11. A multivariate optical element ("MOE") fabricated using the method of any one of claims 1-8 or 9.

12. A non-transitory computer program product comprising instructions which, when executed by at least one processor, causes the processor to perform the method of any one of claims 1-8 or 9.

* * * * *